United States Patent [19]

Mine

[11] Patent Number: 4,884,167
[45] Date of Patent: Nov. 28, 1989

[54] COOLING SYSTEM FOR THREE-DIMENSIONAL IC PACKAGE

[75] Inventor: Shinji Mine, Tokyo, Japan

[73] Assignee: NEC Corporation, Tokyo, Japan

[21] Appl. No.: 268,467

[22] Filed: Nov. 8, 1988

[30] Foreign Application Priority Data

Nov. 9, 1987 [JP] Japan ................................ 62-283454
Nov. 9, 1987 [JP] Japan ................................ 62-283455

[51] Int. Cl.⁴ ............................................. H01L 23/40
[52] U.S. Cl. ................................................... 361/382
[58] Field of Search ................ 361/382, 392, 393, 394, 361/395, 390, 391, 386, 388

[56] References Cited

U.S. PATENT DOCUMENTS

| | | |
|---|---|---|
| 2,783,418 | 2/1957 | Peter et al. . |
| 3,205,469 | 9/1965 | Frank et al. . |
| 3,211,969 | 10/1965 | Colaiaco . |
| 3,651,865 | 3/1972 | Feldmanis . |
| 3,777,220 | 12/1973 | Tatusko et al. . |
| 3,908,188 | 9/1975 | Kawamoto . |
| 3,912,001 | 10/1975 | Missman et al. . |
| 3,993,123 | 11/1976 | Chu et al. . |
| 4,037,270 | 7/1977 | Ahmann et al. . |
| 4,093,971 | 6/1978 | Chu et al. . |
| 4,109,707 | 8/1978 | Wilson et al. . |
| 4,110,549 | 8/1978 | Goetzke et al. . |
| 4,115,836 | 9/1978 | Hutchison et al. ................ 361/382 |
| 4,158,875 | 6/1979 | Tajima et al. . |
| 4,196,775 | 4/1980 | Groh . |
| 4,204,246 | 5/1980 | Arii et al. . |
| 4,245,273 | 1/1981 | Feinberg et al. . |
| 4,282,924 | 8/1981 | Faretra . |
| 4,381,032 | 4/1983 | Cutchaw . |
| 4,398,208 | 8/1983 | Murano et al. . |
| 4,468,717 | 8/1984 | Mathias et al. ................ 361/382 |
| 4,493,010 | 1/1985 | Morrison et al. . |
| 4,498,122 | 2/1985 | Rainal . |
| 4,509,096 | 4/1985 | Baldwin et al. . |
| 4,535,385 | 8/1985 | August et al. . |
| 4,536,824 | 8/1985 | Barrett et al. . |
| 4,546,410 | 10/1985 | Kaufman . |
| 4,574,879 | 3/1987 | DeGree et al. . |
| 4,588,023 | 5/1986 | Munekawa . |
| 4,602,125 | 7/1986 | West et al. . |
| 4,602,678 | 7/1986 | Fick . |
| 4,628,990 | 12/1986 | Hagihara et al. . |
| 4,641,176 | 2/1987 | Keryhuel et al. . |
| 4,644,385 | 2/1987 | Nakanishi et al. . |
| 4,666,545 | 5/1987 | DeGree et al. . |
| 4,686,606 | 8/1987 | Yamada et al. . |
| 4,712,158 | 12/1987 | Kikuchi et al. . |
| 4,721,996 | 1/1988 | Tustaniwskyj et al. . |
| 4,744,007 | 5/1988 | Watari et al. . |
| 4,748,495 | 5/1988 | Kucharek ............................ 361/382 |
| 4,750,086 | 6/1988 | Mittal .................................. 361/382 |
| 4,768,352 | 9/1988 | Maruyama . |
| 4,781,244 | 11/1988 | Kuramitsu et al. . |
| 4,783,721 | 11/1988 | Yamamoto et al. ................ 361/382 |
| 4,791,983 | 12/1988 | Nicol et al. . |
| 4,794,981 | 1/1989 | Mizuno . |

FOREIGN PATENT DOCUMENTS

57-106062 7/1982 Japan .
572951 9/1977 U.S.S.R. .

OTHER PUBLICATIONS

IBM Technical Disclosure Bulletin, "Compliant Cold Plate Cooling Scheme", vol. 21, No. 6, Nov. 1978, V. W. Antonetti et al, p. 2431.

(List continued on next page.)

Primary Examiner—Roy N. Envall, Jr.
Attorney, Agent, or Firm—Burns, Doane, Swecker & Mathis

[57] ABSTRACT

A cooling system for a three-dimensional IC package in which a plurality of substrates each mounting ICs on its one or both surfaces are laminated with a predetermined interval therebetween, includes a cold plate in which holes are formed at positions corresponding to the ICs and a cooling fluid path are formed around the holes, a heat conductive piston, inserted in each hole of the cold plate while keeping a small gap with respect to the inner wall of the hole, and biased by a spring to be moved in the hole, for conducting, when one end thereof is brought into contact with a heat radiating surface of the IC, the heat to the cold plate, and a device for interrupting a contact between the heat conductive piston and the IC so that the substrate can be easily inserted/removed.

5 Claims, 7 Drawing Sheets

OTHER PUBLICATIONS

IBM Technical Disclosure Bulletin, "Counter-Flor Cooling System", vol. 8, No. 11, Apr. 1966.

IBM Technical Disclosure Bulletin, vol. 20, No. 4, Sep. 1977, "Method of Effective Cooling of a High Power Silicon Chip", Doo et al.

IBM Technical Disclosure Bulletin, vol. 20, No. 11A, Apr. 1978, "Three-Dimentional MLC Substrate Integrated Circuit Support Package", Aichelman et al.

IBM Technical Disclosure Bulletin, vol. 20, No. 11A, Apr. 1978, "Conduction-Cooling Module", Hwang et al.

IBM Technical Disclosure Bulletin, vol. 21, No. 6, Nov. 1978, "Solid Encapsulated Module", Chu et al.

IEEE Transactions on Components, Hybrids and Manufacturing Technology, vol. CHMT-2, No. 3, Sep. 1979, "Bumped Tape Automated Bonding (BTAB) Practical Application Guidelines", Kanz et al.

IEEE Transactions on Components, Hybrids, and Manufacturing Technology, vol. CHMT-3, No. 1, Mar. 1980, "IBM Multichip Ceramic Modules for LSI Chips . . .".

A Scientific American Book, "Microelectronics", cover, pp. 51 and 166.

"Assembly Techniques", pp. 404-420.

IBM Technical Disclosure Bulletin, vol. 18, No. 12, pp. 3982-3983, "Heat-Pipe Cooled Stacked Electronic Wafer Package", Kerjilian et al, May 1976.

Electronics, "Supercomputers Demand Innovation is Packaging and Cooling", Lyman, pp. 136-144, Sep. 22, 1982.

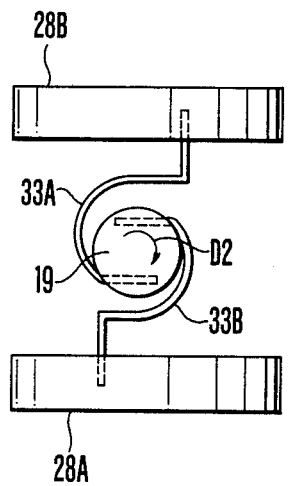
F I G. 8
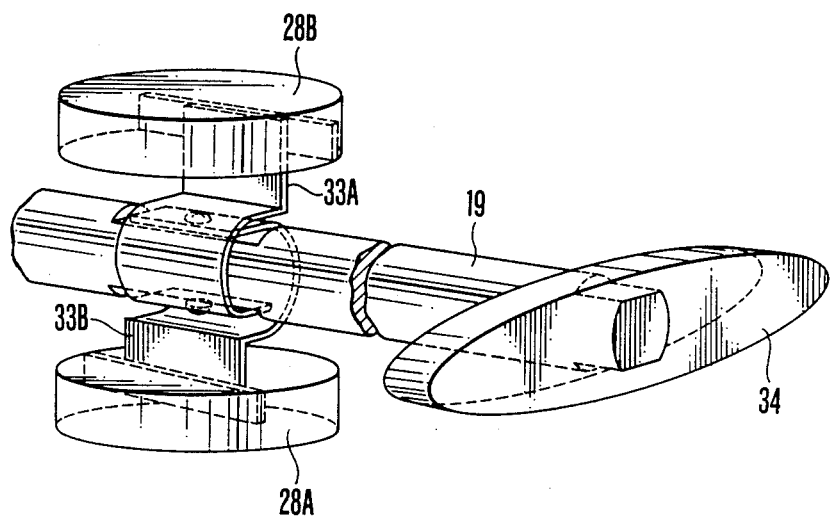
F I G. 9

COOLING SYSTEM FOR THREE-DIMENSIONAL IC PACKAGE

BACKGROUND OF THE INVENTION

The present invention relates to a cooling system for a three-dimensional IC package and, more particularly, to a cooling system for a package having a plurality of laminated substrates mounting ICs thereon.

Recently, the degree of integration of semiconductor devices has improved, the sizes of printed circuit boards or ceramic substrates have increased, and the number of mounted devices per substrate has increased. As a result, the packing density of ICs has significantly improved. As the total amount of heat generated in ICs is increased, a demand has arisen for a cooling technique having high performance and good efficiency. In particular, large apparatuses have adapted a conductive cooling system in which a heat radiating surface of an IC is thermally connected to a member called a cold plate having a cooling fluid path therein.

A typical example of the conductive cooling system according to a conventional technique is disclosed in U.S. Pat. No. 4,245,273. In this conventional technique, a cap structure is mounted on a substrate on which a plurality of ICs are mounted. This cap has a plurality of conductive pistons biased downwardly into contact with the IC devices by springs, respectively. On the top surface of this cap, a cooling jacket in which a suitable cooling fluid can be circulated is mounted.

Recently, in order to increase the packing density of ICs, a three-dimensional IC package in which a plurality of substrates each mounting ICs thereon are laminated with a small interval therebetween has been adopted. In such a three-dimensional IC package, since the requirement for the interval between the substrates is strict, it is difficult to adopt the cap structure according to the above conventional technique. In addition, maintainability is degraded as the size of the substrate is increased, resulting in high cost.

SUMMARY OF THE INVENTION

It is an object of the present invention to provide a cooling system for a three-dimensional IC package free from the above conventional drawbacks.

According to the present invention, a cooling system for a three-dimensional IC package in which substrates each mounting a plurality of IC devices on at least one surface thereof are laminated with a predetermined interval therebetween in a chassis, comprises cold plates, fixed parallel to each other in the chassis with a predetermined interval therebetween for housing the substrate, holes being formed in each of the cold plates at positions corresponding to heat radiating surfaces of the IC devices when the substrate is inserted in the interval, and a cooling fluid path for flowing a fluid being formed around the holes, at least one heat conductive piston, inserted in each of the holes of the cold plate while a small gap is kept between an inner wall of the hole and the heat conductive piston, vertically biased by spring means to vertically move in the hole, and when the IC devices operate, biased by the spring means and brought into contact with the heat radiating surface of a corresponding one of the IC devices, and conducting heat generated from the IC device to the cold plate through the gap, and heat conductive piston adjusting means for releasing, when maintenance of the substrate is to be performed, a contact between the heat conductive piston and the IC device against a biasing force of the spring means, thereby enabling insertion/removal of the substrate with respect to the chassis.

BRIEF DESCRIPTION OF THE DRAWINGS

FIGS. 6, 7, 8 and 9 are views for explaining a structure and an operation of part of FIG. 5.

DETAILED DESCRIPTION OF THE PREFERRED EMBODIMENTS

Embodiments of the present invention will be described in detail below with reference to the accompanying drawings.

Figure 1:
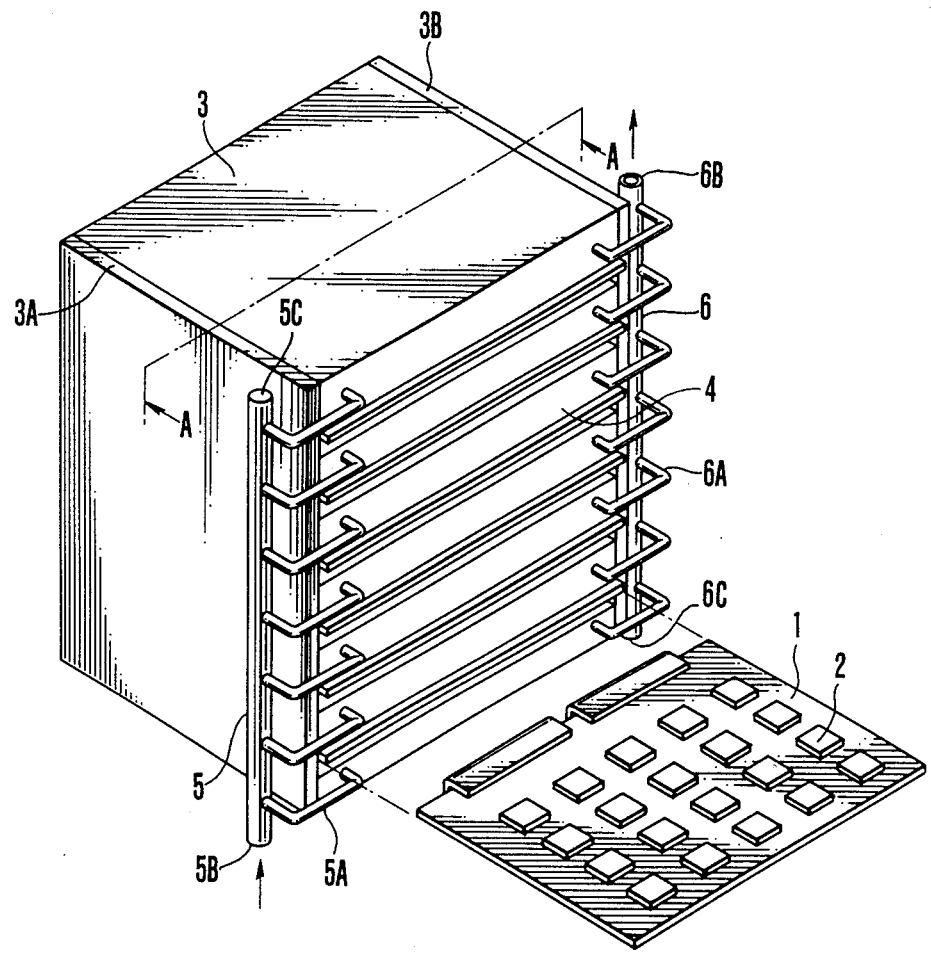
FIG. 1 is a perspective view showing an embodiment of the present invention.
Figure 2:
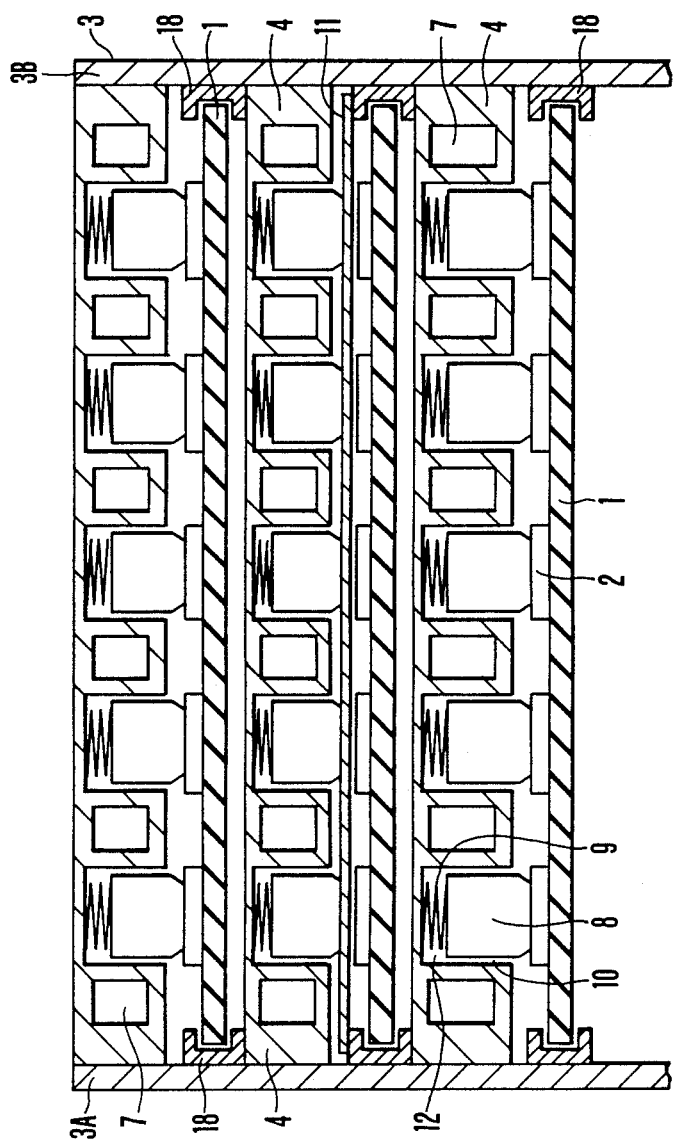
FIG. 2 a sectional view taken along a line A—A of FIG. 1.

FIG. 1 is a perspective view of a three-dimensional IC package according to an embodiment of the present invention. FIG. 2 is a sectional view taken along a line A—A of FIG. 1.

In FIG. 1, reference numeral 1 denotes a substrate mounting a plurality of integrated circuit (IC) devices 2 on its top surface; and 3, a hollow chassis having side plates 3A and 3B. In the chassis 3, a plurality of cold plates 4 each having a cooling fluid path are horizontally arranged with a predetermined interval therebetween so that both ends of each cold plate 4 are fixed to the inner side surfaces of the side plates 3A and 3B, as will be described later. The substrate 1 is inserted and housed between adjacent cold plates 4 as will be described later.

Pipes 5 and 6 for supplying a cooling fluid are vertically mounted outside the side plates 3A and 3B of the chassis 3, respectively. One end of each of the pipes 5 and 6 is closed, and the other end thereof serves as an inlet/outlet port of a cooling fluid. A plurality of branch pipes 5A and 6A each corresponding to the cold plate 4 branch from the pipes 5 and 6, respectively. Each of the branch pipes 5A and 6A is connected to an inlet or outlet port of the cooling fluid path of a corresponding cold plate 4.

In FIGS. 1 and 2, a cooling fluid supplied from the lower end of the pipe 5 is discharged from the upper end of the pipe 6 through the branch pipes 5A, the cooling fluid paths of the cold plates 4, and the branch pipes 6A. Note that a direction of a flow of the cooling fluid is not limited to the one shown in FIG. 1.

FIG. 2 illustrates combinations of the substrates 1 and the cold plates 4 from the first to third upper stages of the chassis 3.

In FIG. 2, guide rails 18 having a U sectional shape are horizontally fixed to the inner side surfaces of the chassis 3 between adjacent cold plates 4 so that their guide grooves face inward. The substrate 1 mounting the IC devices 2 thereon is guided at its right and left ends by the guide grooves of right and left guide rails 18 arranged at the same level and inserted in/removed from the chassis 3. The upper end of each guide rail is set slightly higher than the top surface of the IC device 2 so that the substrate can be inserted.

Holes 12 are formed in each cold plate 4 at positions corresponding to the IC devices 2 when the substrate is inserted. A heat conductive piston 8 is inserted in each hole 12. A small gap 10 is formed between the outer surface of each heat conductive piston 8 and the inner surface of the hole 12, and the upper end of the heat conductive piston 8 is connected to the cold plate 4 through a spring 9, so that the heat conductive piston 8 can be vertically moved in the hole 12.

Cooling fluid paths 7 are formed in portions within the cold plate surrounding the holes 12.

In order to insert the substrate 1 in the chassis 3, a tool plate 11 is inserted along the top surfaces of the guide rails 18 to push the heat conductive pistons 8 upward. Therefore, since a gap is formed between the top surfaces of the IC devices 2 and the lower surface of the tool plate 11, the substrate 1 can be easily inserted along the guide rails 18.

When the tool plate 11 is pulled out after the substrate 1 is inserted, each heat conductive piston 8 is pushed downward by a corresponding spring 9 and is brought into contact with the top surface of a corresponding one of the IC devices 2. In operation, heat generated from the IC devices 2 is conducted to a cooling fluid flowing in the cooling fluid path 7 through the heat conductive pistons 8, the gaps 10, and the cold plate 4. In FIGS. 1 and 2, the substrates 1 in the first and third stages are in operation.

In maintenance, the tool plate 11 is inserted between the heat conductive pistons 8 and the IC devices 2 against a biasing force of the springs 9, thereby disconnecting the heat conductive pistons 8 from the IC devices 2. Therefore, the substrate 1 can be easily pulled out from the chassis 3. In FIG. 2, the substrate 1 at the second stage is in this state. Note that the lower end of each heat conductive piston is chamferred to facilitate insertion/removal of the tool plate 11.

Figure 3:
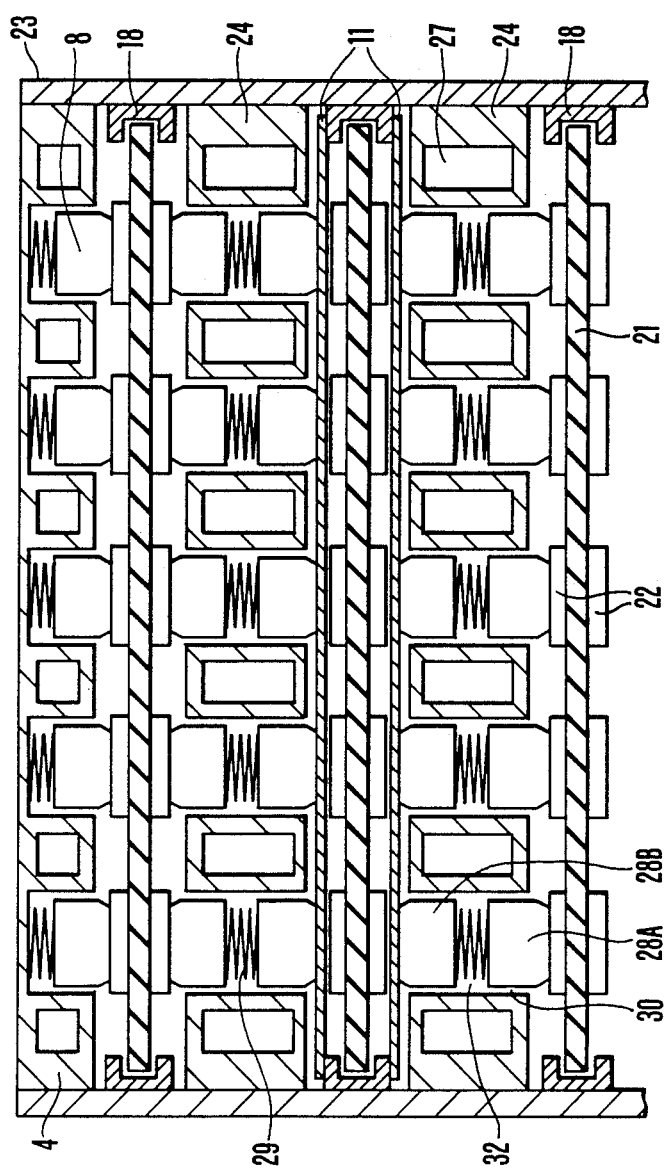
FIG. 3 a sectional view showing another embodiment of the present invention.

FIG. 3 is a sectional view showing another embodiment of the cooling system for an IC package comprising substrates 21 each mounting IC devices 22 on its both surfaces. In FIG. 3, substrates 21 from the first to third upper stages are shown.

In FIG. 3, the structures of a cold plate 4 and heat conductive pistons 8 provided at the uppermost stage are the same as those in the embodiment shown in FIG. 2.

In stages from the second stage, cold plates 24 higher than the cold plate 4 are horizontally fixed to a chassis 23 with a predetermined interval therebetween. Guide rails 18 are fixed to the chassis 23 in the same manner as in the embodiment shown in FIG. 2.

Through holes 32 are formed between opposing IC devices 22 of the substrates 21 inserted above and below the cold plate 24. A pair of heat conductive pistons 28A and 28B are disposed in each through hole 32 so that the heat conductive pistons 28A and 28B are biased in opposite directions by a spring 29, that their outer end surfaces are brought into contact with the surfaces of the opposing IC devices, and that they can be vertically moved while keeping small gaps 30 with respect to the inner surfaces of the through hole 32.

Cooling fluid paths 27 are formed in the cold plate 24 at both sides of each through hole 32.

The substrate 21 is inserted as follows. That is, tool plates 11 are inserted above and below the substrate 21 to be inserted along the top and bottom surfaces of the guide rails 18, thereby interrupting contacts between heat radiating surfaces of the IC device 22 mounted on both surfaces of the substrate 21 and the heat conductive pistons 28A and 28B. At the same time, a small gap is formed between the tool plate 11 and the IC devices 22, so that the substrate 21 can be inserted. In an operation performed without the tool plate 11, heat generated from opposing IC devices 22 mounted on the top and bottom surfaces of adjacent substrates 21 is conducted to a cooling fluid flowing in the cooling fluid path 27 through the heat conductive pistons 28B and 28A, the gaps 30, and the cold plate 24, thereby performing cooling.

Figure 4:
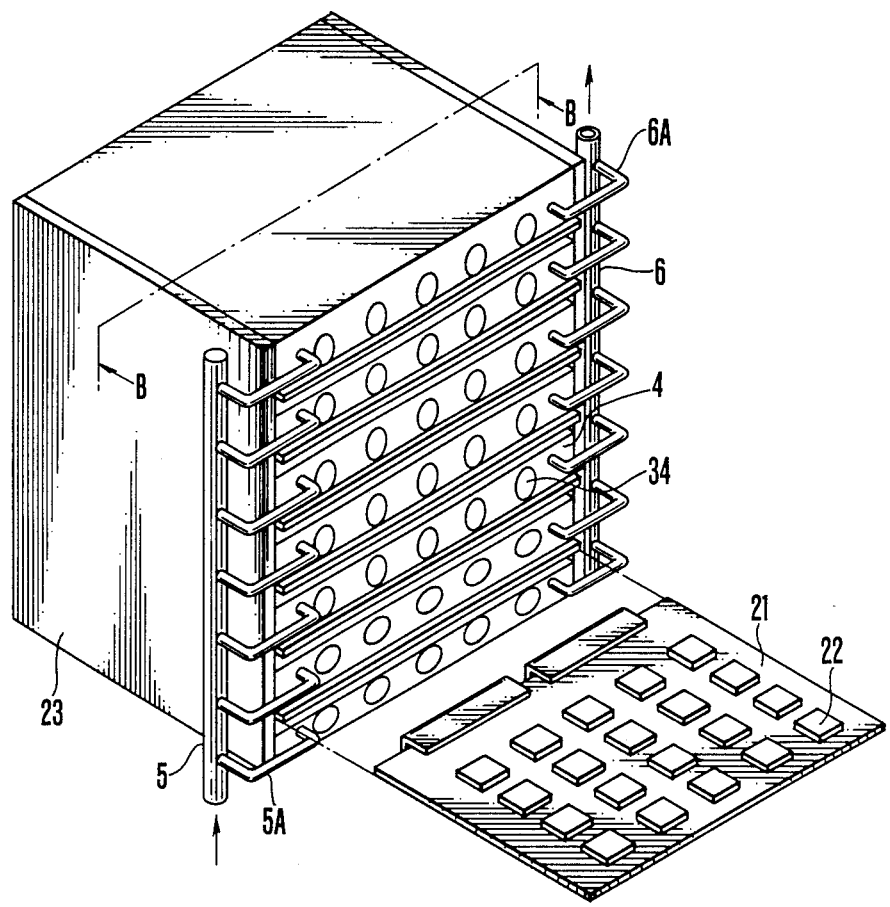
FIG. 4 is a perspective view showing still another embodiment of the present invention.
Figure 5:
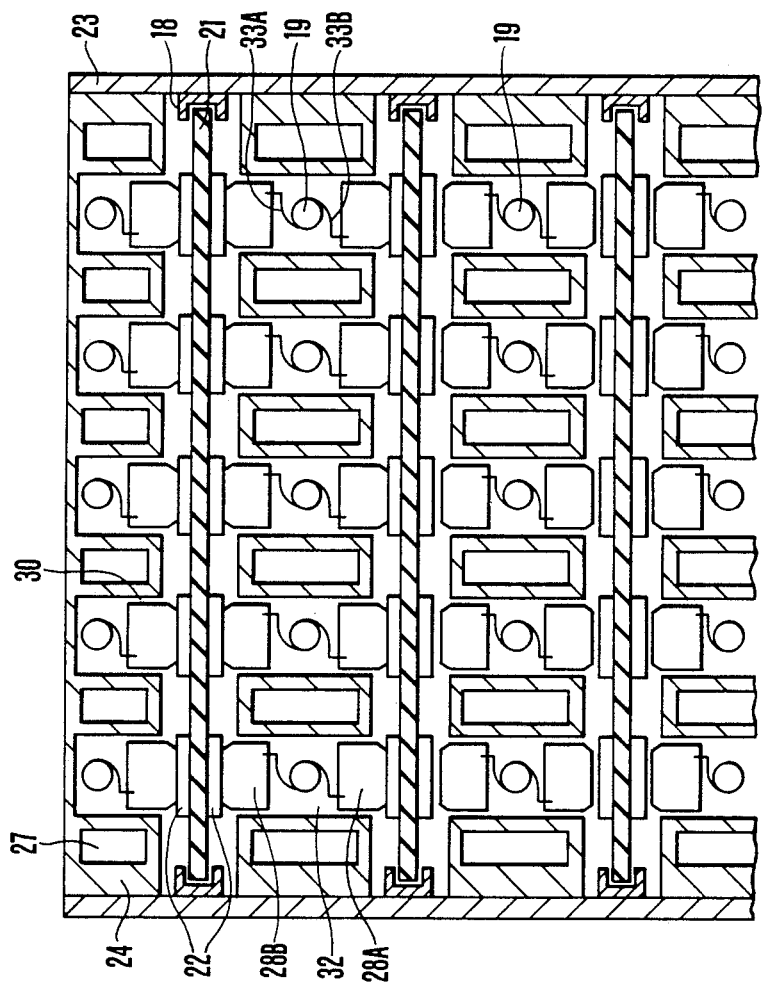
FIG. 5 is a sectional view taken along a line B—B of FIG. 4.

FIG. 4 is a perspective view showing still another embodiment of the present invention, and FIG. 5 is a sectional view taken along a line B—B of FIG. 4.

In FIGS. 4 and 5, the same reference numerals as in FIGS. 1 and 3 denote the same parts, and a detailed description thereof will be omitted.

A difference between the embodiment shown in FIGS. 4 and 5 and the embodiment shown in FIG. 1 is that in FIGS. 4 and 5, a spring 29 for connecting a pair of heat conductive pistons 28A and 28B is replaced with curved leaf springs 33A and 33B one end of each of which is fixed to a rotary shaft 19 and the other end thereof is fixed to a corresponding one of the heat conductive pistons 28A and 28B, so that a substrate 1 can be inserted/removed without using a tool plate 11.

FIGS. 6 to 9 show a connection structure, formed between the heat conductive pistons 28A and 28B, and consisting of the leaf springs 33A and 33B and the shaft 19, and an operation of this structure.

The leaf springs 33A and 33B have the same structure. That is, one end of each of the leaf springs 33A and 33B is fixed to the rotary shaft 19 at a position opposing the position of one end of the other leaf spring located in a diameter direction of the rotary shaft 19, and the leaf springs 33A and 33B are curved to surround the rotary shaft 19. The other ends of the leaf springs 33A and 33B are perpendicularly inserted in and fixed to the bottom and top surfaces of the heat conductive pistons 28B and 28A, respectively.

When the rotary shaft 19 is rotated by knob 34 mounted at its front end, a distance between heat conductive pistons 28A and 28B is adjusted. That is, in FIGS. 6 and 7, the rotary shaft 19 is rotated in a direction of arrow D1, i.e., a direction to expand the leaf springs 33A and 33B. In FIGS. 8 and 9, the rotary shaft 19 is rotated in a direction of arrow D2, i.e., a direction to compress the leaf springs 33A and 33B.

Figure 6:
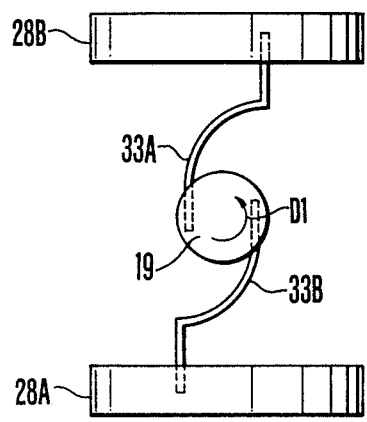
Figure 7:
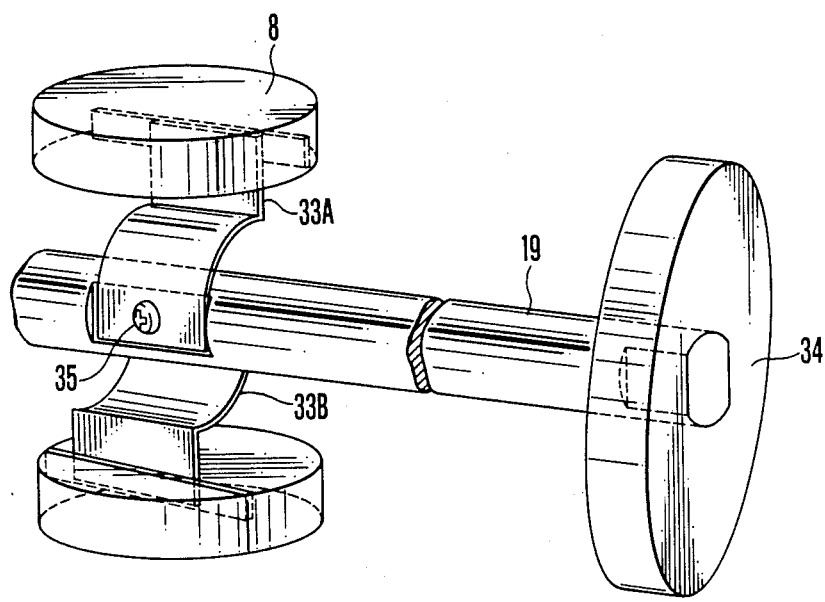

The rotary shaft 19 at the second stage in FIG. 5 shows the state shown in FIG. 6. In this state, the heat conductive pistons 28A and 28B are biased to move away from each other and brought into contact with corresponding IC devices 22. The rotary shaft 19 at the third stage in FIG. 5 shows the state shown in FIG. 8. In this case, the heat conductive pistons 28A and 28B move closer to each other, and therefore contacts between the heat conductive pistons 28A and 28B and corresponding IC devices 22 are released, thereby enabling insertion/removal of the substrate.

A heat radiating path of heat generated from the IC devices 22 during operation is similar to the embodiment shown in FIG. 3.

As has been described above, according to the cooling system of the present invention, heat conductive pistons are biased by springs against and brought into contact with corresponding ICs. Therefore, a variation in IC mounting heights can be absorbed. In addition, since a substrate can be replaced while a cold plate is left in a chassis, the weight of the substrate can be reduced, and a cooling fluid system need not be interrupted upon maintenance or replacement.

What is claimed is:

1. A cooling system for a three-dimensional IC package in which substrates each mounting a plurality of IC devices on at least one surface thereof are laminated with a predetermined interval therebetween in a chassis, comprising:

cold plates, fixed parallel to each other in said chassis with a predetermined interval therebetween for housing said substrate, holes being formed in each of said cold plates at positions corresponding to heat radiating surfaces of said IC devices when said substrate is inserted in said interval, and a cooling fluid path for flowing a fluid being formed around said holes;

at least one heat conductive piston, inserted in each of said holes of said cold plate while a small gap is kept between an inner wall of said hole and said heat conductive piston, vertically biased by spring means to vertically move in said hole, and when said IC devices operate, biased by said spring means and brought into contact with said heat radiating surface of a corresponding one of said IC devices, and conducting heat generated from said IC device to said cold plate through said gap; and heat conductive piston adjusting means for releasing, when maintenance of said substrate is to be performed, a contact between said heat conductive piston and said IC device against a biasing force of said spring means, thereby enabling insertion/removal of said substrate with respect to said chassis.

2. A system according to claim 1, wherein said heat conductive piston adjusting means includes a tool plate to be inserted in/removed from between said heat conductive pistons and said IC devices.

3. A system according to claim 1, wherein said holes formed in said cold plate are through holes, a pair of heat conductive pistons connected through said spring means is vertically moved in each of said through holes, and upper and lower ends of said pair of heat conductive pistons are associated with said IC devices mounted on bottom and top surfaces of said substrates inserted above and below said cold plate.

4. A system according to claim 3, wherein said spring means for connecting said pair of heat conductive pistons includes a shaft horizontally provided between said pair of heat conductive pistons, and two leaf springs, one end of each of which is connected to a position opposing a position of one end of the other leaf spring in a diameter direction, the other ends thereof are connected to said pair of heat conductive pistons, and are curved to surround said shaft, and when said shaft is rotated in a clockwise or counterclockwise direction, said oair of heat conductive pistons are moved closer to or away from each other.

5. A system according to claim 1, further comprising branch pipes, connected to said cooling fluid paths of said cold plates, and extending from said chassis toward side portions thereof, and cooling fluid supplying and discharging pipes.

* * * * *